United States Patent [19]

Nozawa

[11] Patent Number: 5,859,600
[45] Date of Patent: *Jan. 12, 1999

[54] APPARATUS FOR MODULATING DIGITAL DATA AND ADDING CONTROL DATA

[75] Inventor: Shingo Nozawa, Yokohama, Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 531,329

[22] Filed: Sep. 20, 1995

[30] Foreign Application Priority Data

Sep. 28, 1994 [JP] Japan .................................. 6-233048
Sep. 28, 1994 [JP] Japan .................................. 6-233049
Sep. 28, 1994 [JP] Japan .................................. 6-233050

[51] Int. Cl.$^6$ .................................................. H03M 7/00
[52] U.S. Cl. ............................................. 341/59; 341/58
[58] Field of Search ............................. 341/59, 58

[56] References Cited

U.S. PATENT DOCUMENTS 5,142,421  8/1992  Kahlman et al. ........................ 360/40
5,537,112  7/1996  Tsang ........................................ 341/59

FOREIGN PATENT DOCUMENTS 4-255969  9/1992  Japan .

*Primary Examiner*—Marc S. Hoff
*Attorney, Agent, or Firm*—Fitzpatrick, Cella, Harper & Scinto

[57] ABSTRACT

An apparatus for modulating input data so that at least a part of a predetermined number of the input data is influenced by control data and adding the control data every predetermined number of modulated input data. The apparatus includes (a) modulating mechanism for modulating the input data so that a portion of the predetermined number of the input data exerts an influence on a part of another predetermined number of the input data; (b) detecting mechanism for detecting a specific frequency component in the modulated input data that is outputted from the modulating mechanism; (c) generating mechanism for generating the control data in accordance with an output of the detecting mechanism; and (d) selecting mechanism for selectively outputting the control data generated by the generating mechanism, data that is influenced by the control data in output data of the modulating mechanism, and data that is not influenced by the control data.

24 Claims, 12 Drawing Sheets

APPARATUS FOR MODULATING DIGITAL DATA AND ADDING CONTROL DATA

BACKGROUND OF THE INVENTION

1. Field of the Invention

The invention relates to a data processing apparatus and, more particularly, to an apparatus for digitally modulating input data and outputting.

2. Related Background Art

As such a kind of apparatus, a digital VTR for recording and reproducing a digital signal to/from a recording medium has conventionally been known.

Among such VTRs, particularly, in a digital VTR for an industrial use, when the digital signal is recorded to a magnetic tape, it is necessary to reduce a consumption amount of the magnetic tape by raising a recording density by narrowing a track width as much as possible or the like. As a result of that the recording track width is narrowed as mentioned above, in order to correctly reproduce the recording signal, what is called a tracking such that the head accurately traces the recording track is important.

An apparatus for multiplexing a pilot signal for tracking in the digital VTR to the recording signal has been disclosed in Japanese Patent Application Laid-Open No. 4-255969.

FIG. 1 is a block diagram showing a conventional construction of such a kind of apparatus for multiplexing the pilot signal to the recording signal.

In FIG. 1, a recording signal inputted from an input terminal 601 is outputted to a "0" addition circuit 602 and a "1" addition circuit 603 every 24 bits and is added with "0" and "1" as control bits, respectively. The resultant signals are outputted to 2T precoders 604 and 605. The precoders 604 and 605 interleaved NRZI modulate the data of 25 bits and output the modulated signals to component extraction circuits 606 and 607, bit successive detection circuits 608 and 609, and a selection circuit 611.

Each of the component extraction circuits 606 and 607 calculates a predetermined frequency component or DC component of a pilot signal to be multiplexed in a coupled signal train from the signal train which has already been encoded and a supplied 25-bit information word, to detect a correlation with the pilot signal component, and outputs the encoded signal train and 25-bit information word to a comparison circuit 610.

The comparison circuit 610 compares the component which is supplied from the component extraction circuit 606 and the component which is supplied from the component extraction circuit 607 and outputs a signal indicative of the component having a higher correlation for the pilot signal component to the selection circuit 611.

Each of the bit successive detection circuits 608 and 609 calculates the maximum number of successive bits "0" or "1" in the 25-bit information word supplied and outputs to the selection circuit 611. The selection circuit 611 fundamentally outputs the information word on the side shown by the signal from the comparison circuit 610 in 25 bits which are supplied from the precoders 604 and 605 to an output terminal 612.

However, when one of the maximum numbers which are supplied from the bit successive detection circuits 608 and 609 is, for example, equal to or larger than 10, the selection circuit 611 preferentially outputs the 25-bit information word on the side of the small maximum number to the output terminal 612.

In the conventional apparatus as mentioned above, however, the precoder, component extraction circuit, and bit successive detection circuit are necessary on each of the side for addition of "0" and the side for addition of "1", so that a circuit scale increases.

Further, there is also considered a method whereby the precoder, component extraction circuit, and bit successive detection circuit are shared on both of the "0" addition side and the "1" addition side and are time-divisionally used. In this case, however, since it is necessary to raise an operation clock speed of the apparatus, the costs rise.

SUMMARY OF THE INVENTION

It is an object of the invention to solve the problems as mentioned above.

Another object of the invention is to accurately and effectively control (an amount of) a predetermined frequency component in input data without enlarging a circuit scale.

Under such objects, according to the present invention, as one embodiment, there is provided an apparatus for apparatus for modulating input data so that at least a part of said predetermined number of data is influenced by the control data and adding control data every predetermined number of modulated input data, comprising: modulating means for modulating the input data so that a portion of the predetermined number of input data exerts an influence on a part of another predetermined number of input data; detecting means for detecting a specific frequency component in the modulated data that is outputted from the modulating means; generating means for generating the control data in accordance with an output of the detecting means; and selecting means for selectively outputting the control data generated by said generating means, data that is influenced by the control data in output data of the modulating means, and data that is not influenced by the control data.

Further another object of the invention is to detect a state of data after completion of a modulation without enlarging a circuit scale.

The above and other objects and features of the present invention will become apparent from the following detailed description and the appended claims with reference to the accompanying drawings.

DETAILED DESCRIPTION OF THE PREFERRED EMBODIMENT

An embodiment of the invention will now be described in detail hereinbelow with reference to the drawings.

Figure 1:
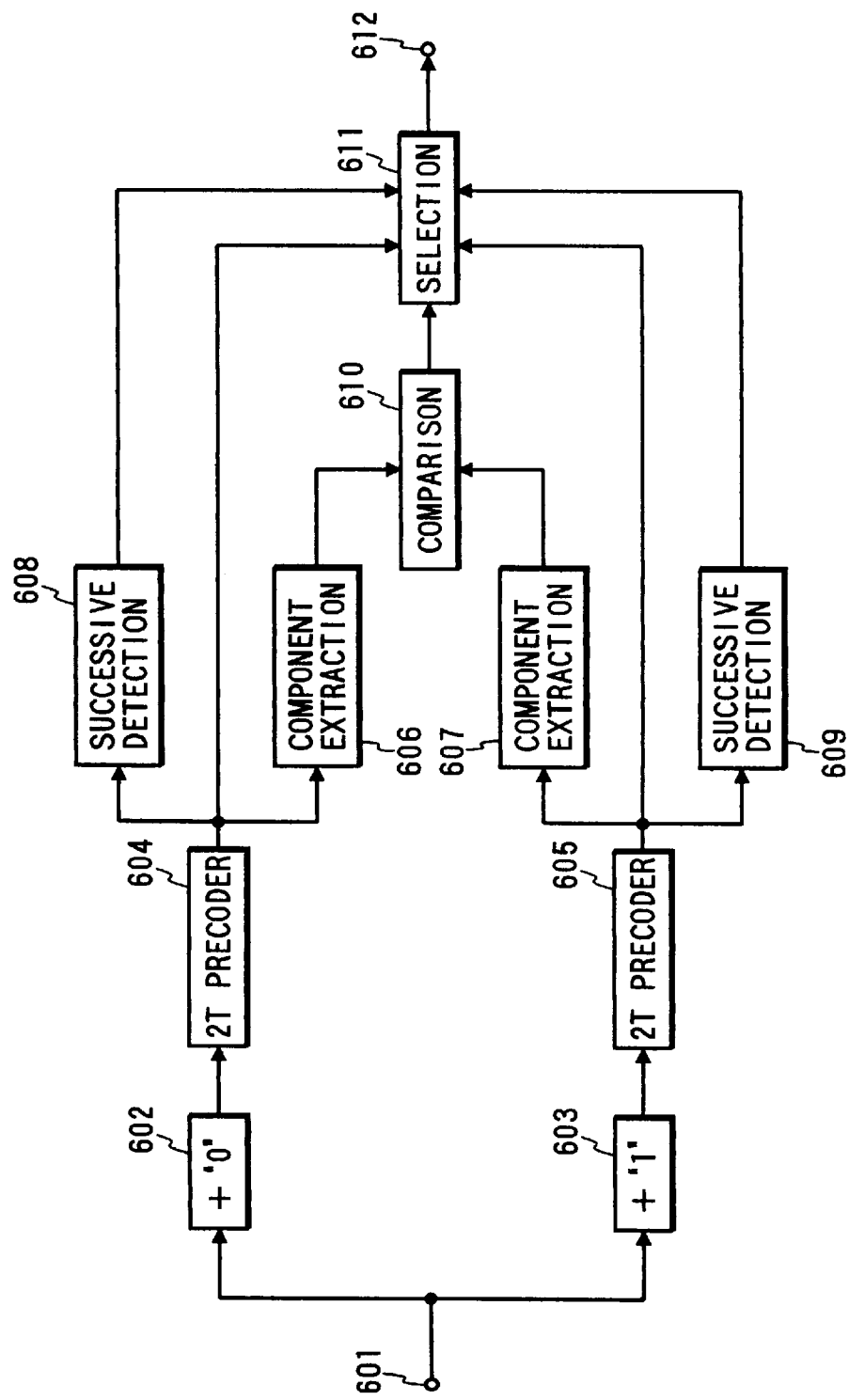
FIG. 1 is an explanatory diagram of a conventional apparatus.
Figure 2:
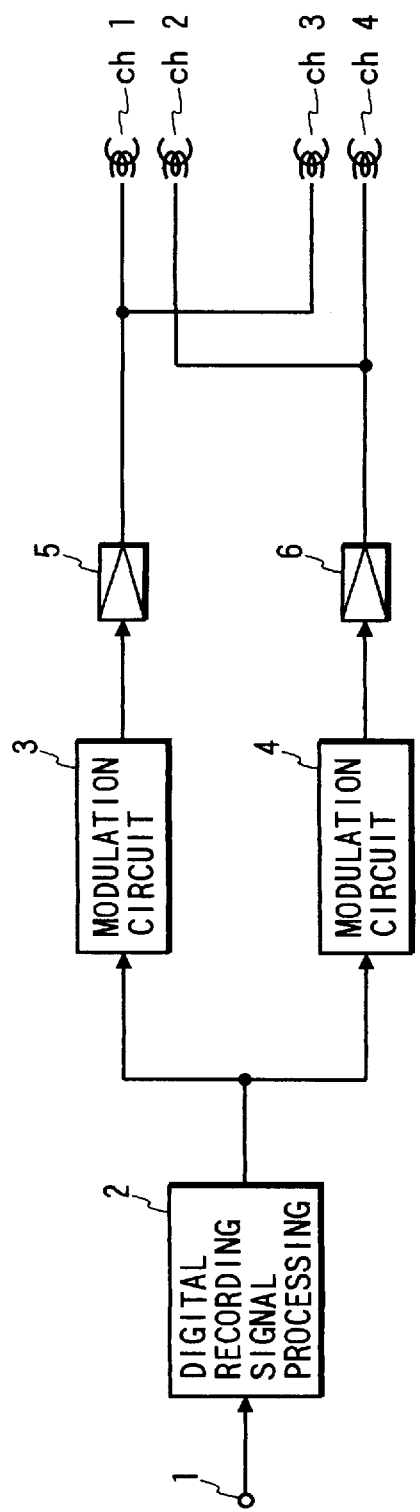
FIG. 2 is a diagram showing a construction of a digital VTR as an embodiment of the invention.

In the embodiment, the case of applying the invention to a digital VTR will be explained. FIG. 2 is a block diagram showing a schematic construction of a recording system of the digital VTR in which a pilot signal for tracking control is multiplexed and the recording is performed according to the invention.

In the diagram, reference numeral 1 denotes an input terminal to which a digital signal including a video signal, an audio signal, and the like is inputted. Reference numeral 2 denotes a digital signal processing circuit for performing a compression of a data amount, an encoding of data, an addition of an ID code, a sync code, an error correction code, etc., and the like to the digital signal inputted from the input terminal 1. In the embodiment, it is now assumed that the data of length 2 n bits (hereinafter, referred to as a code word) of 24 bits in which data consisting of eight bits per one word is simultaneously outputted every three data is outputted in parallel from the digital signal processing circuit 2.

The 24-bit data is supplied to modulation circuits 3 and 4, respectively. Each of the modulation circuits 3 and 4 converts the 24-bit data to 25-bit (2 n+1-bit) data and adjusts amounts of component of predetermined frequencies f1 and f2 and a DC component when such a data group is returned to a bit stream and outputs as will be explained hereinlater.

The modulation circuit 3 generates the bit stream in which each component of f1, f2, and DC is suppressed. The modulation circuit 4 similarly generates the bit stream having each component of f1, f2, and DC.

In FIG. 2, reference numerals 5 and 6 denote recording amplifiers which supply the bit streams generated from the modulation circuits 3 and 4 to heads ch1 and ch3 and to heads ch2 and ch4, respectively.

The modulation circuits 3 and 4 in FIG. 2 according to an embodiment of the invention will now be described.

Figure 3:
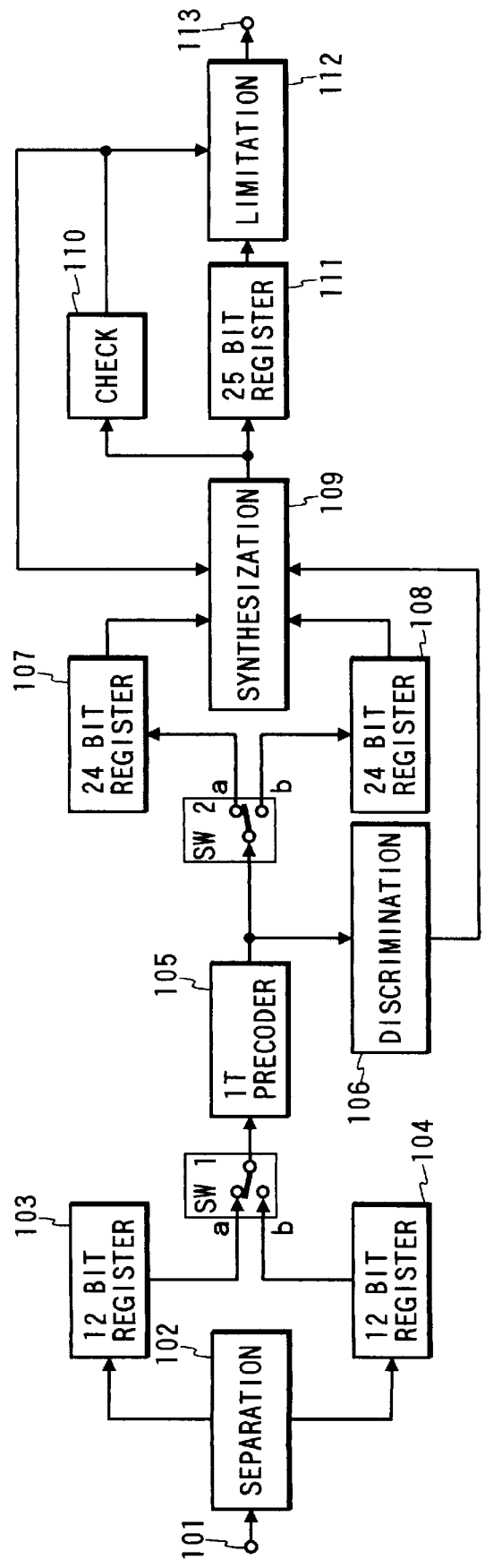
FIG. 3 is a diagram showing a construction of a modulation circuit in FIG. 2.

FIG. 3 is a block diagram showing a construction of the modulation circuits 3 and 4. Although the operations slightly differ in the case where the circuit of FIG. 3 functions as a modulation circuit 3 and the case where it functions as a modulation circuit 4, it will be explained hereinlater.

In FIG. 3, the data outputted from the digital signal processing circuit 2 is inputted every 24 bits from an input terminal 101 and separated to a data train consisting of twelve (n) odd-number designated bits and a data train consisting of twelve even-number designated bits by a separation circuit 102. The odd-number designated data train is outputted to a 12-bit register 103. The even-number designated data train is outputted to a 12-bit register 104.

In the embodiment, since the input data of 24 bits is processed from the odd-number designated data train, switches SW1 and SW2 are first connected to an (a) side. The odd-number designated data train stored in the register 103 is supplied through the switch SW1 to a 1T precoder 105, by which an NRZI modulation is performed. The NRZI process is a process for obtaining the EXOR of each data that is successively inputted. An output of the precoder 105 is supplied through the switch SW2 to a 24-bit register 107 and is also outputted to a discrimination circuit 106.

The 1T precoder 105 and discrimination circuit 106 will now be described hereinbelow with reference to FIG. 4.

Figure 4:
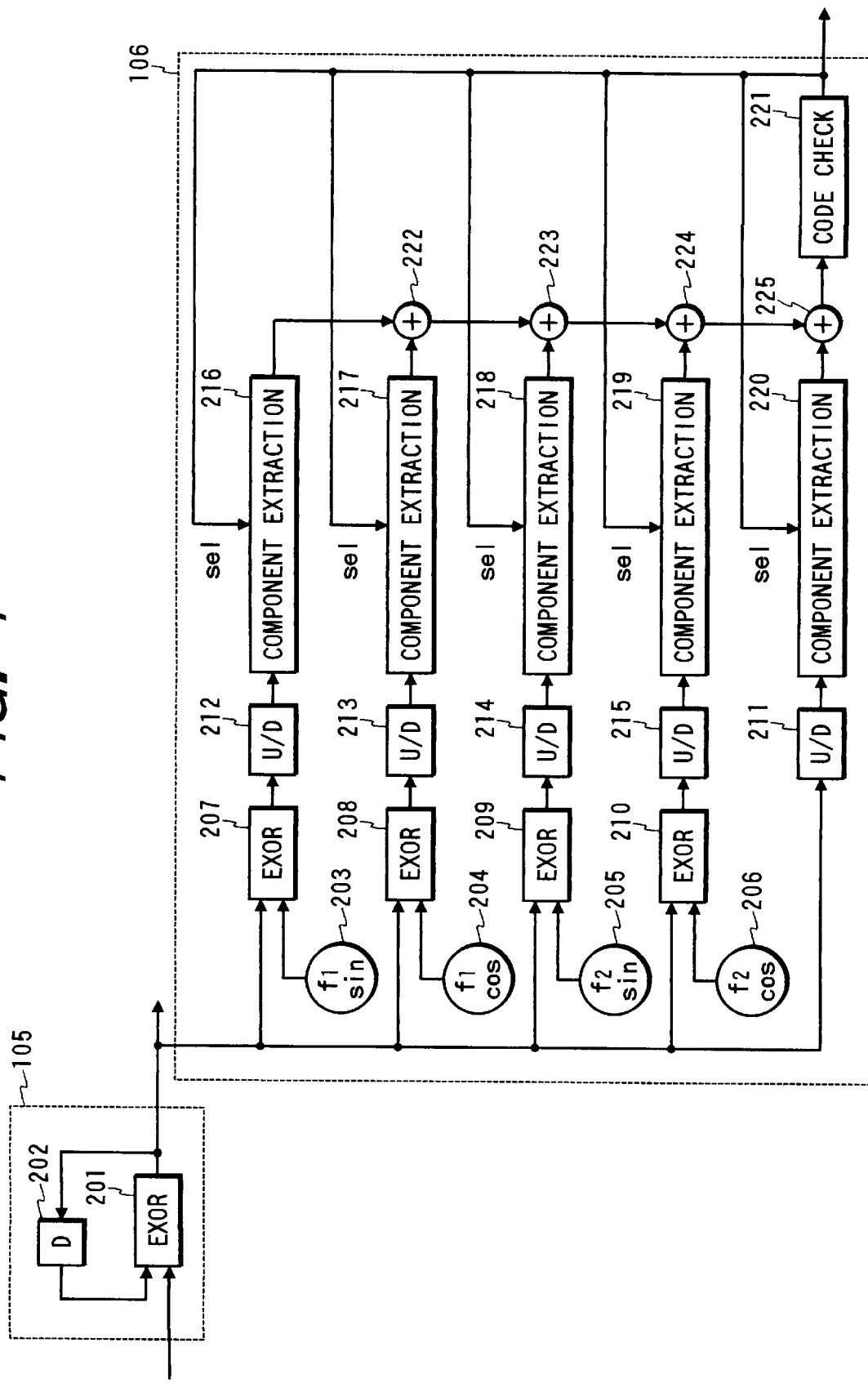
FIG. 4 is a diagram showing a construction of a precoder and a discrimination circuit in FIG. 3.

FIG. 4 is a block diagram showing a construction of the 1T precoder 105 and discrimination circuit 106. In FIG. 4, the data train of 12 bits from the switch SW1 is serially supplied to an EXOR circuit 201, by which the EXOR between the 12-bit data train supplied and the data which is preceding by one clock and which was outputted from a 1-bit register 202 is got and outputted. An output of the EXOR circuit 201 is delayed by a time corresponding to one clock by the 1-bit register 202 and is again fed back to the EXOR circuit 201 and is also supplied to the discrimination circuit 106.

In the discrimination circuit 106, the 12-bit output data of the precoder 105 is serially supplied to EXOR circuits 207 to 210 and an up/down counter 211. Signal generation circuits 203 to 206 generate a sine component (hereinafter, referred to as a sin component) and a cosine component (hereinafter, referred to as cos component) at the frequencies f1 and f2 of the pilot signals to be multiplexed as two-value rectangular wave signals and supplies to the EXOR circuits 207 to 210, respectively. The EXOR circuits 207 to 210 calculate the EXOR between the 12-bit data inputted and the pilot components and output the results to up/down counters 212 to 215.

Figure 5:
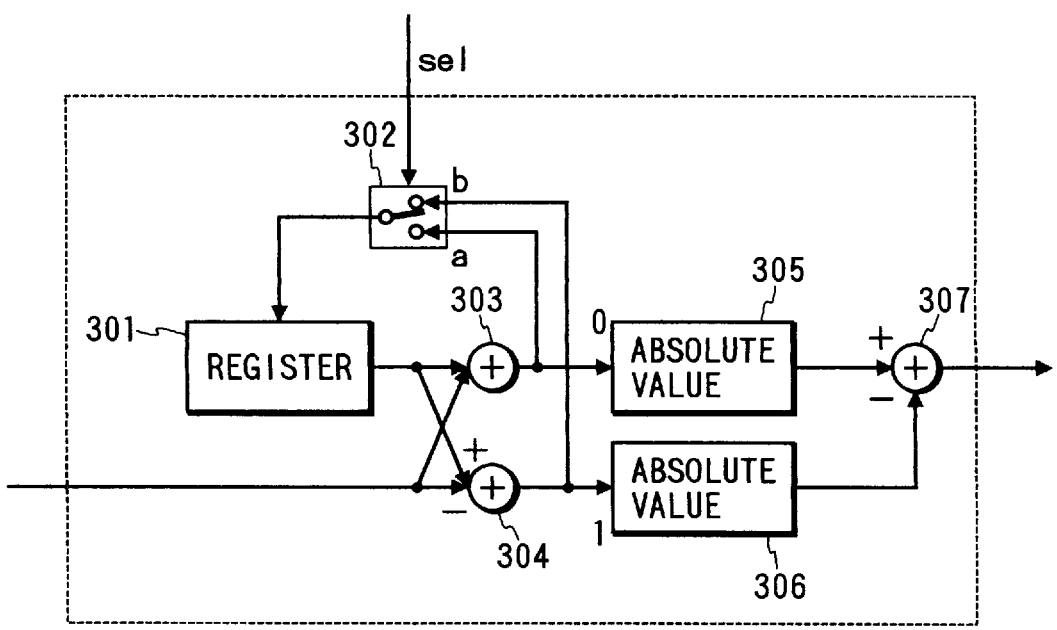
FIG. 5 is a diagram showing a construction of a component extraction circuit in FIG. 4.

When the input data is equal to "1", the up/down counters 211 to 215 set internal registers to +1, and when the input data is equal to "0", the up/down counters 211 to 215 set the internal registers to −1. Count results for the data of 12 bits are outputted to component extraction circuits 216 to 219. FIG. 5 shows a construction of each of the component extraction circuits. Each of the component extraction circuits 216 to 220 has a similar construction.

In FIG. 5, outputs of the up/down counters 212 to 215 are supplied to an adder 303 and a subtracter 304, by which they are arithmetically operated to an output of a register 301, respectively. A career of the arithmetic operation results so far as will be explained hereinlater has been stored in the register 301. The adder 303 adds the input data and the data of the register 301 and outputs the resultant data to an absolute value circuit 305. The subtracter 304 subtracts the input data from the data of the register 301 and outputs the resultant data to an absolute value circuit 306. The above arithmetic operations correspond to the sum of the output of the register 301 and up/down counter outputs in the case where different bits ("0" or "1") were added as control data to the head of total 24 bits of the even-number designated twelve bits of one code word which had been inputted just before and the odd-number designated twelve bits inputted at present and the preceding (NRZI) was executed.

Each of the absolute value circuits 305 and 306 calculates the absolute value of the input data and outputs to a subtracter 307. The subtracter 307 subtracts an output of the absolute value circuit 306 from an output of the absolute value circuit 305 and outputs the resultant value to adders 222 to 224.

Outputs of the component extraction circuits 216 to 219 are added by the adders 222 to 224, respectively, and the resultant values are supplied to an adder 225.

In a manner similar to the foregoing up/down counters, the up/down counter 211 arithmetically operates the 24-bit data that is successively inputted as it is and outputs the result to the component extraction circuit 220. This means that the DC component in the input 24-bit data is arithmetically operated. The component extraction circuit 220 likewise executes an arithmetic operation to the input data and outputs the result to the adder 225. The adder 225 adds an output from the adder 224 and an output from the component extraction circuit 220 and supplies the result to a code check circuit 221.

The code check circuit 221 generates "1" when the input data is positive and "0" when the input data is negative.

In the embodiment, the EXOR between the rectangular wave signals of two values of the sin component and cos component of each pilot signal and the input data is got and the result is arithmetically operated by the up/down counter. Therefore, an output of this up/down counter indicates a phase difference between the input data and the two-value signal or a degree of correlation with each pilot signal component.

Namely, when the absolute value of the output of the up/down counter is small, the phase difference with each rectangular wave signal is small. When the absolute value is large, the phase difference with each rectangular wave signal is large. In the embodiment, in case of suppressing each component of f1, f2, and DC by the modulation circuit 3, the output in which the absolute value of the addition result of the outputs of the up/down counter and the register 301 is small is outputted as final modulated data. In case of adding each component of f1, f2, and DC by the modulation circuit 4, on the other hand, the output in which the absolute value of the addition result of the outputs of the up/down counter and the register 301 is large is outputted as final modulated data.

In the embodiment, an output of the adder 303 indicates the processing result of the data in the case where the control data "0" was added to the input of 12 bits and the resultant data was precoded. An output of the subtracter 304 indicates the data processing result in the case where the control data "1" was added and the resultant data was precoded.

After completion of all of the processes for the data train of the odd-number designated 12 bits, an output of the code check circuit 221 is supplied from the discrimination circuit 106 to a synthesization circuit 109 and is also outputted as a selection signal sel in each of the component extraction circuits 216 to 220. A switch 302 in FIG. 5 is switched in accordance with the selection signal. In the embodiment, when the output of the code check circuit 221 is equal to "0", the switch 302 is connected to the (a) side. When it is equal to "1", the switch 302 is connected to the (b) side. Therefore, when the output of the code check circuit 221 is equal to "0", the output of the adder 303 is selected. When it is equal to "1", the output of the subtracter 304 is selected.

A fact that the output of the code check circuit 221 is equal to "0" means that the absolute value of the output of the absolute value circuit 306 is small as mentioned above.

In the embodiment, the output of the adder 303 as data of the smaller absolute value is selected and stored into the register 301, thereby controlling so as to suppress each component of f1, f2, and DC as mentioned above.

In case of controlling so as to add each component of f1, f2, and DC, the output of the adder 304 as data of the larger absolute value is selected and stored into the register 301.

After completion of the arithmetic operations as mentioned above for the odd-number designated data, the switches SW1 and SW2 are connected to the (b) side. At the same time, the 1-bit register 202 in the precoder 105 is reset to "0". The values of the up/down counters 216 to 220 in the discrimination circuit 106 are reset to "0". After completion of the modulating processes of the data of one track, the value of the register 301 is reset to "0".

Although the arithmetic operations are executed to the remaining even-number designated data, only the logic operation with each two-value signal and the arithmetic operation by each up/down counter are executed with respect to the even-number designated data and the processes after the component extraction circuits are not executed. The reasons will be explained hereinlater.

The even-number designated data read out from the register 104 is NRZI converted as mentioned above by the IT precoder 105 and is stored into a 24-bit register 108 through the switch SW2. The 24-bit registers 107 and 108 store the odd-number designated input data and the even-number designated input data as much as 24 bits, namely, the data of two code words, respectively. The data of the odd-number 12 bits stored in the 24-bit register 107 is the data that is not influenced by the control data when the control data was added and the interleaved NRZI modulation was executed in the input 24-bit data. The data of the even-number 12 bits stored in the 24-bit register 108 is the data in which the state after completion of the modulation is inverted depending on the state of the control data, namely, whether the control data is equal to "0" or "1".

Figure 6:
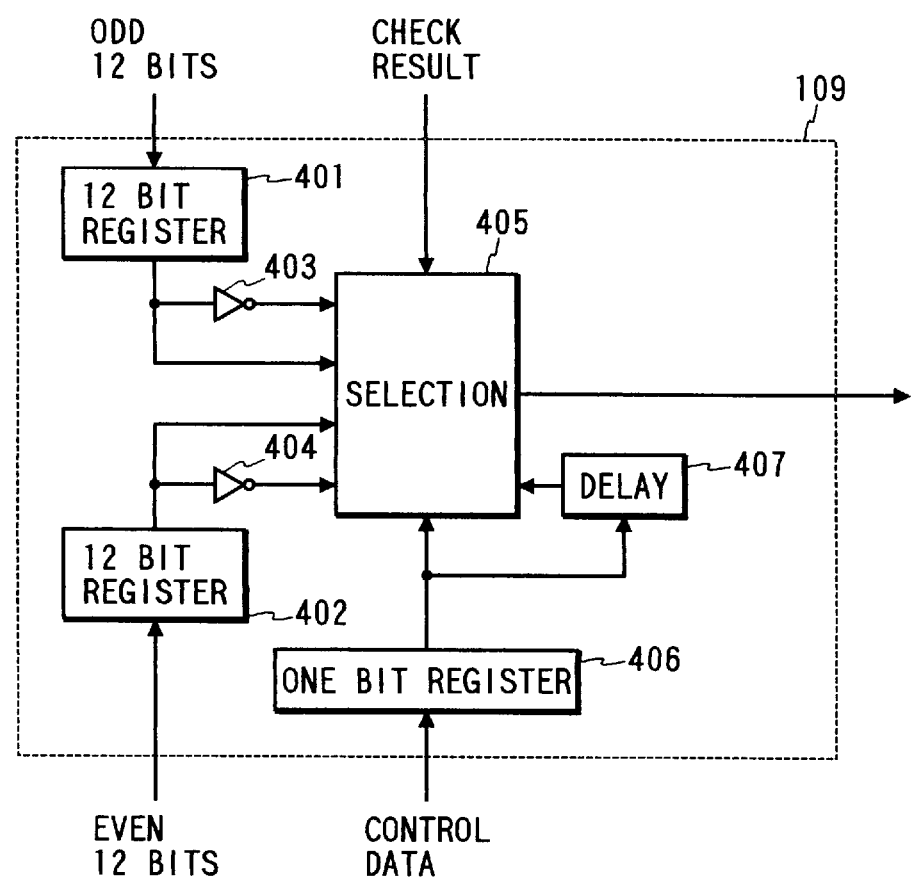
FIG. 6 is a diagram showing a construction of a synthesization circuit in FIG. 3.

The data read out from the registers 107 and 108 is outputted to the synthesization circuit 109. FIG. 6 shows a construction of the synthesization circuit 109.

In FIG. 6, the odd-number designated data of 12 bits preceding by one code word of the data which was inputted just now and processed is inputted from the register 107 to the 12-bit register 401. Similarly, the even-number designated data of 12 bits preceding by one code word of the data which was inputted just now and processed is inputted to the 12-bit register 402. The control data of one bit as a code check result outputted from the discrimination circuit 106 is inputted to the 1-bit register 406. The 1-bit register 406 supplies the control data to a selection circuit 405.

The odd-number designated 12-bit data read out from the register 401 is supplied to the selection circuit 405 and an inversion circuit 403. Each bit is inverted by the inversion circuit 403 and outputted to the selection circuit 405.

The even-number designated 12-bit data read out from the register 402 is likewise outputted to the selection circuit 405 and an inversion circuit 404. Each bit is inverted by the inversion circuit 404 and outputted to the selection circuit 405.

Further, the control data of one bit outputted from a check circuit 110 and the control data added to the 24-bit data preceding by one code word of the data inputted at present to registers 401 and 402 which was delayed by a time corresponding to one code word by a delay circuit 407 are inputted to the selection circuit 405 as will be explained hereinlater. The selection circuit 405 selectively generates output data of the registers 107 and 108 and inversion circuits 403 and 404 in accordance with the control data from the delay circuit 407 and a check result from the check circuit 110.

Namely, with respect to the even-number designated data, when the control data from the discrimination circuit 106 is equal to "0", the data read out from the register 402 is directly outputted. When the control data is equal to "1", the inverted result from the inversion circuit 404 is outputted.

With respect to the odd-number designated data, first, the output of the inversion circuit 403 and the output from the 12-bit register 401 are selectively generated in accordance with the control data added to the 24-bit data which is preceding by one code word and which was outputted from the delay circuit 407.

Namely, the odd 12-bit data stored in the 12-bit register 401 is influenced by the odd data in the 25-bit data obtained by adding the control data to the 24-bit data preceding by one code word of the data inputted to the register 401, namely, by the control data added to the 24 bits of one code word just before. In the embodiment, the initial value of the 1T precoder 105 is set to "0" and the EXOR is calculated as mentioned above. Therefore, when the control data added to the 24 bits just before is equal to "1", all of the codes of the odd data stored in the register 401 have to be inverted.

Therefore, when the output of the delay circuit 407 is equal to "1", the selection circuit 405 selects the output of the inversion circuit 403 in the meantime. The meaning of "in the meantime" will be explained hereinlater.

Figure 7:
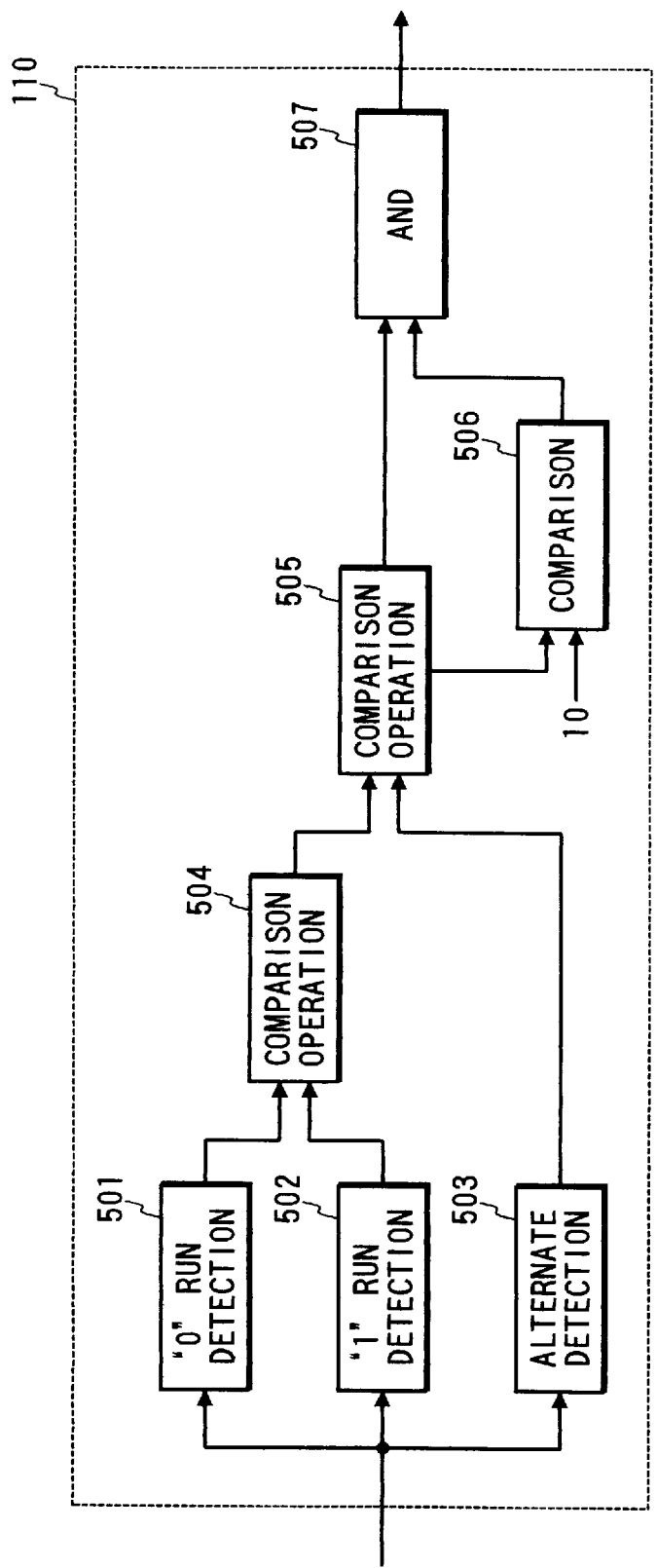
FIG. 7 is a diagram showing a construction of a check circuit in FIG. 3.

The 25-bit data outputted from the selection circuit 405 is supplied to a 25-bit register 111 and the check circuit 110. FIG. 7 is a block diagram showing a construction of the check circuit 110.

In FIG. 7, a "0" run detection circuit 501 counts the successive number of the longest bits "0" in the 25-bit data inputted and generates a count value. A "1" run detection circuit 502 counts the successive number of the longest bits "1" in the 25-bit data inputted and generates a count value. An alternate bit detection circuit 503 counts the maximum number of bits "0" and "1" which are alternately arranged in the 25-bit data inputted and generates a count value.

Outputs of the detection circuits 501 and 502 are supplied to a comparison circuit 504, by which the larger data is supplied to a comparison operation circuit 505. The comparison operation circuit 505 supplies either one of an output of the comparison circuit 504 and an output of the alternate bit detection circuit 504 to a comparison circuit 506. When the output of the comparison operation circuit 504 is larger, "1" is supplied to an AND circuit 507. When the output from the alternate bit detection circuit 503 is larger, "0" is supplied to the AND circuit 507.

The comparison circuit 506 generates "1" when the value of the signal supplied from the comparison operation circuit 505 is equal to or larger than 10 and generates "0" in the other cases.

The AND circuit 507 calculates the AND between the output of the comparison operation circuit 505 and the output of the comparison circuit 506 and supplies to the 1-bit register 406 of the synthesization circuit 109 and to limitation circuit 112.

The limitation circuit 112 directly supplies the data held in the 25-bit register 111 to an output terminal 113 when an output of the AND circuit 507 is equal to "0". When it is equal to "1", the limitation circuit 112 inverts only the odd data including one bit of the control data added by the synthesization circuit 109 in the 25-bit data and supplies the resultant data to the output terminal 113. The reason why such processes are executed is to avoid that a specific bit continues in the modulated data for a long period of time and to prevent that the DC component is included in the modulated data as much as possible.

The check result of the check circuit is supplied to the selection circuit 405 of the synthesization circuit 109. When the check result is equal to "0", the selection circuit 405 directly generates the data on the selected side in accordance with the output of the delay circuit 407. When the check result is equal to "1", the selection circuit 405 selects the output on the side opposite to the selected side in accordance with the output of the delay circuit 407. This is because the output data in the embodiment corresponds to the result obtained by executing the interleaved NRZI modulation to the inputted 24-bit data. The above processes are performed to compensate that an influence by the foregoing inverting operation appears in the odd data in the 24-bit data that is inputted after that.

The operation of the check circuit 110 shown in FIG. 7 will now be described in more detail with reference to FIG. 8.

Figure 8:
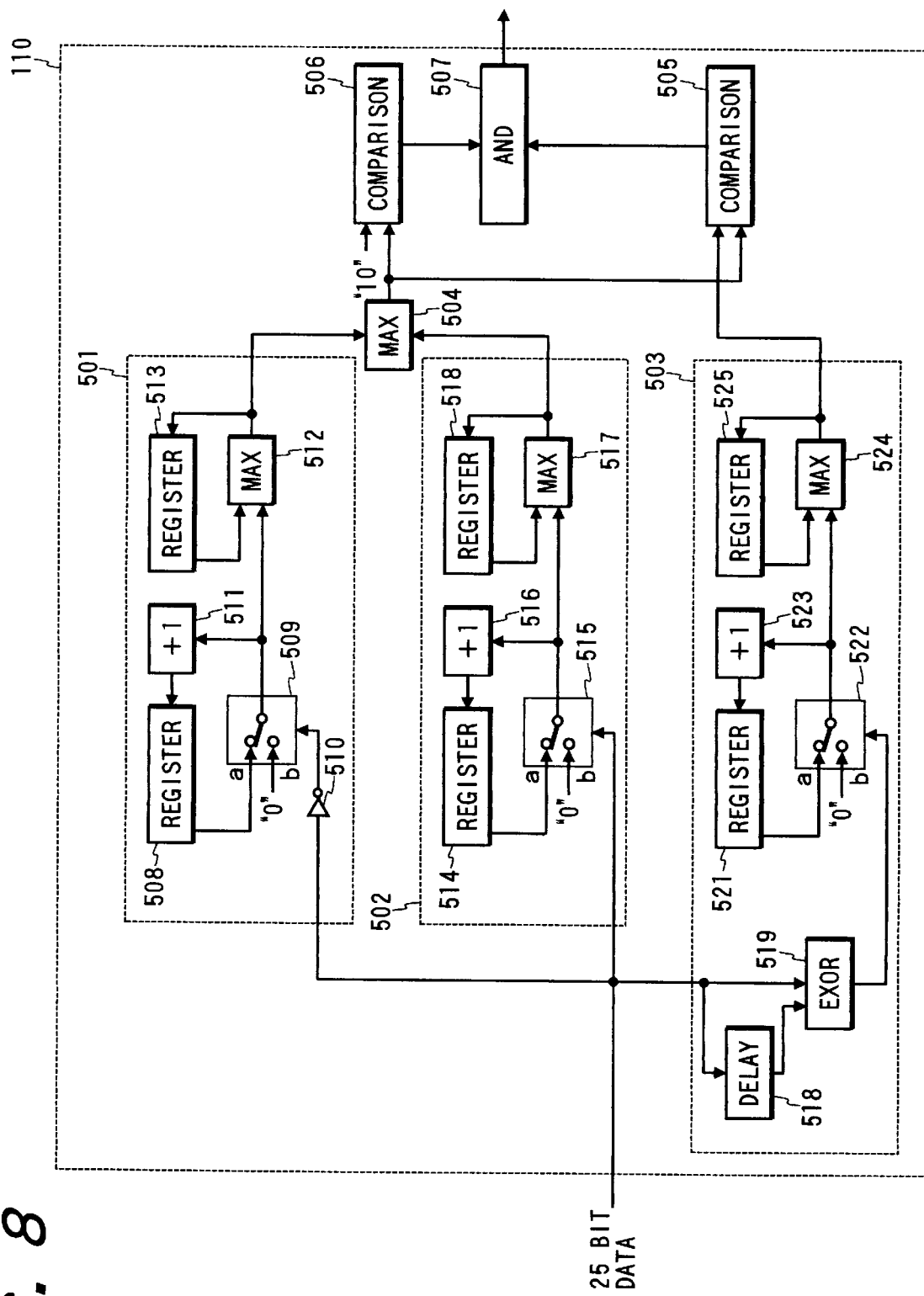
FIG. 8 is a diagram showing a detailed construction of the circuit in FIG. 7.

In FIG. 8, the 25-bit data inputted from the synthesization circuit 109 is inputted to the "0" run detection circuit 501, "1" run detection circuit 502, and alternate bit detection circuit 503, respectively. First, in the "0" run detection circuit 501, the input data is inverted by an inversion circuit 510 and is supplied as a switching control signal to a switch 509. The switch 509 is connected to an (a) terminal when the control signal is equal to "1" and to a (b) terminal when the control signal is equal to "0".

An output of the switch 509 is supplied to a "1" addition circuit 511 and a maximum value selection circuit 512. The "1" addition circuit 511 adds "1" to an output of the switch 509 and supplies the resultant value to a register 508. The register 508 holds an output of the "1" addition circuit 511. Therefore, the value stored in the register 508 shows the number of successive bits "0" in the 25-bit data inputted. The contents in the register 508 are reset every 25 bits.

The output data from the switch 509 and output data from a register 513 are inputted to the maximum value selection circuit 512. The maximum value selection circuit 512 selects the output data of the larger value and supplies to a maximum value selection circuit 504. Therefore, the maximum number of successive bits "0" so far is generated by the maximum value selection circuit 512.

The "1" run detection circuit 502 operates in a manner similar to the "0" run detection circuit 501 except a point that a switch 515 is switched in accordance with the input data itself.

In the alternate bit detection circuit 503, the input data is supplied to a delay circuit 518 and an EXOR circuit 519. The EXOR circuit 519 calculates the EXOR between the input data and the data which was delayed by a time of one clock by the delay circuit 518 and supplies as a switching control signal of a switch 522. Namely, an output of the EXOR circuit 519 indicates the number of successive times of the alternate bits. In the embodiment, "0" is inputted every 25 bits as an initial value of the EXOR circuit. The subsequent operations are similar to those in each of the detection circuits.

The maximum value selection circuit 504 selects one output of the larger value between the outputs of the "0" run detection circuit 501 and "1" run detection circuit 502 and supplies to the comparison operation circuit 505 and comparison circuit 506.

The comparison circuit 505 compares the value generated from the alternate bit detection circuit 503 and the value generated from the maximum value selection circuit 504. When the value generated from the alternate bit detection circuit 503 is larger, the comparison operation circuit 505 outputs "1". In the other cases, "0" is outputted.

The comparison circuit 506 outputs "0" when the value supplied from the maximum value selection circuit 504 is equal to or larger than 10. In the other cases, "1" is outputted.

The AND circuit 507 calculates the AND between the output of the comparison operation circuit 505 and the output of the comparison circuit 506 and supplies to a 1-bit register 406 of the synthesization circuit 109 and to the limitation circuit 112.

Figure 9A:
FIGS. 9A to 9C are diagrams for explaining the operation of a limitation circuit in FIG. 3.
Figure 9B:
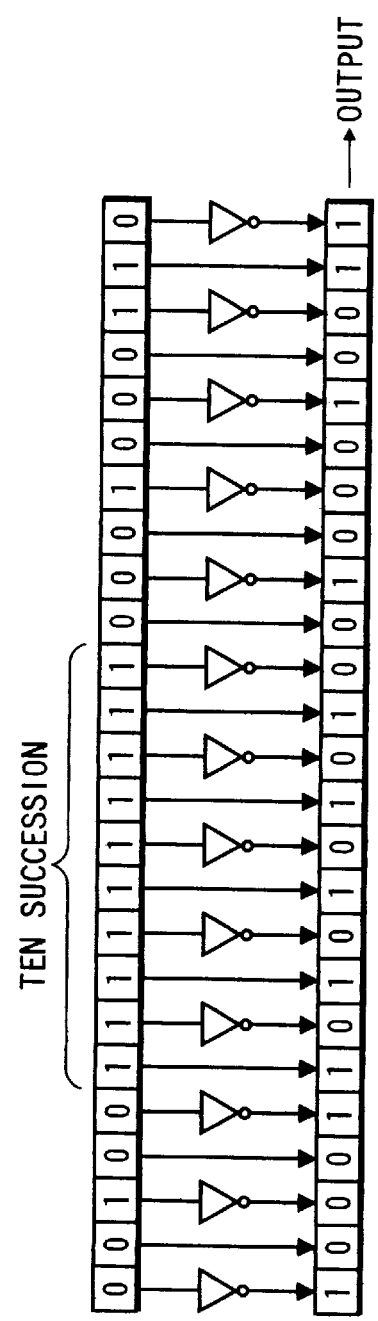
Figure 9C:
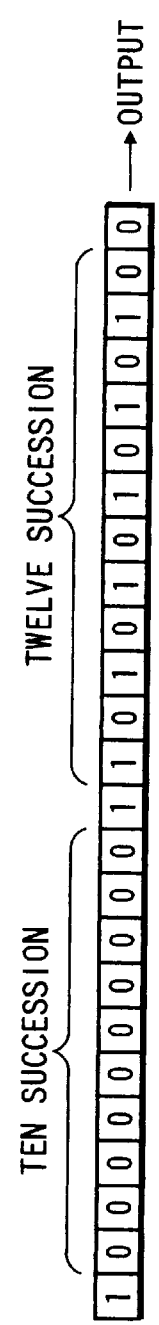

FIGS. 9A to 9C show examples of the modulated 25-bit data. In the case shown in FIG. 9A, since the successive number of data of each of the bits "0" and "1" is less than 10, the data is generated as it is. In case of FIG. 9B, since ten bits "1" continue, the odd-number designated bits are inverted and the resultant data is outputted. In case of FIG. 9C, since the number of alternate bits "0" and "1" is longer than the successive number of bits "0" or "1", the data is outputted as it is.

The modulating operation in the embodiment will now be described.

Figure 10:
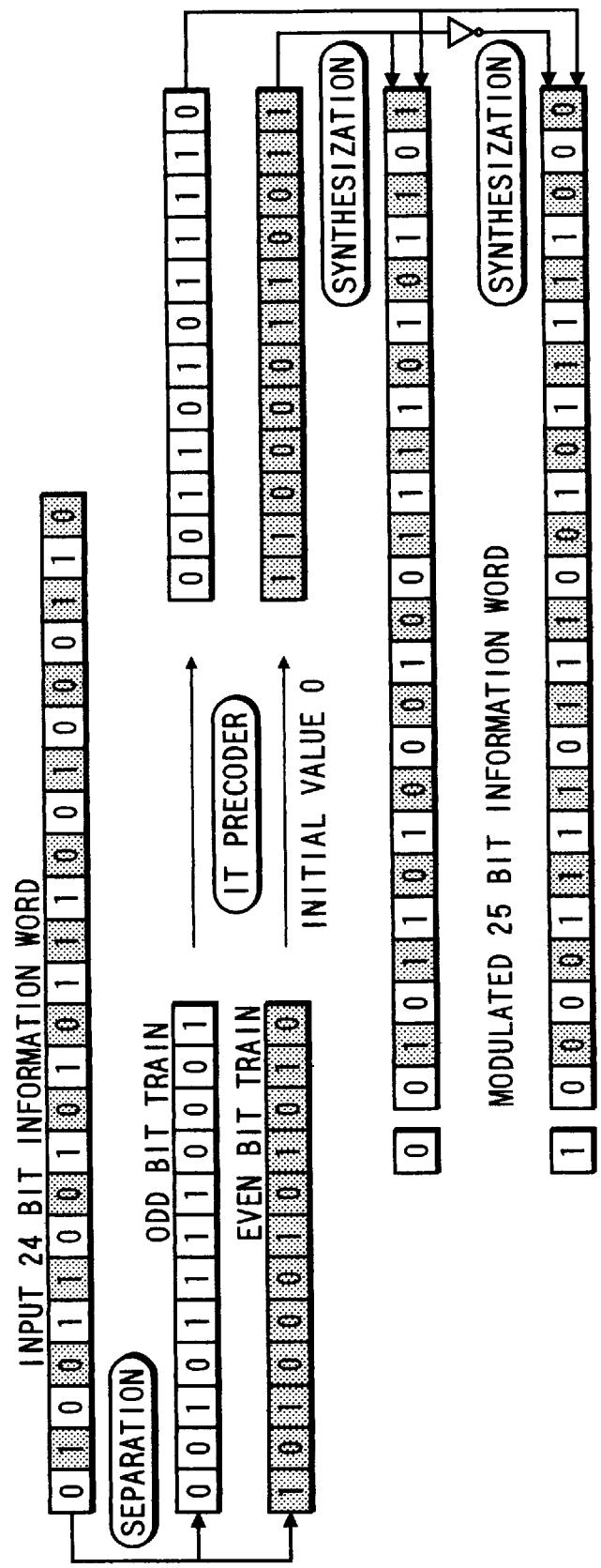
FIG. 10 is a diagram for explaining a modulating operation in the embodiment of the invention.

FIG. 10 is a diagram for explaining the modulating operation in the embodiment and shows a state in which the interleaved NRZI modulation is executed to the 25-bit data obtained by adding one bit of the control data to the 24-bit data inputted, thereby obtaining the modulated data.

As shown in the diagram, in the embodiment, the odd data is first NRZI modulated and, after that, the initial value is reset to "0" and the even data is NRZI modulated. Since the result of the interleaved NRZI modulation of the odd data is the same as the result of the NRZI modulation irrespective of the judgment about whether the control data is equal to "1" or "0", the data is outputted as it is.

On the other hand, as for the even data, its relation is inverted depending on the result regarding whether the control data is equal to "1" or "0". Therefore, whether the inverted data is outputted or not is decided in accordance with the judgment result of the discrimination circuit 106.

A deciding method of the control data will now be described further in detail with reference to FIG. 11.

Figure 11:
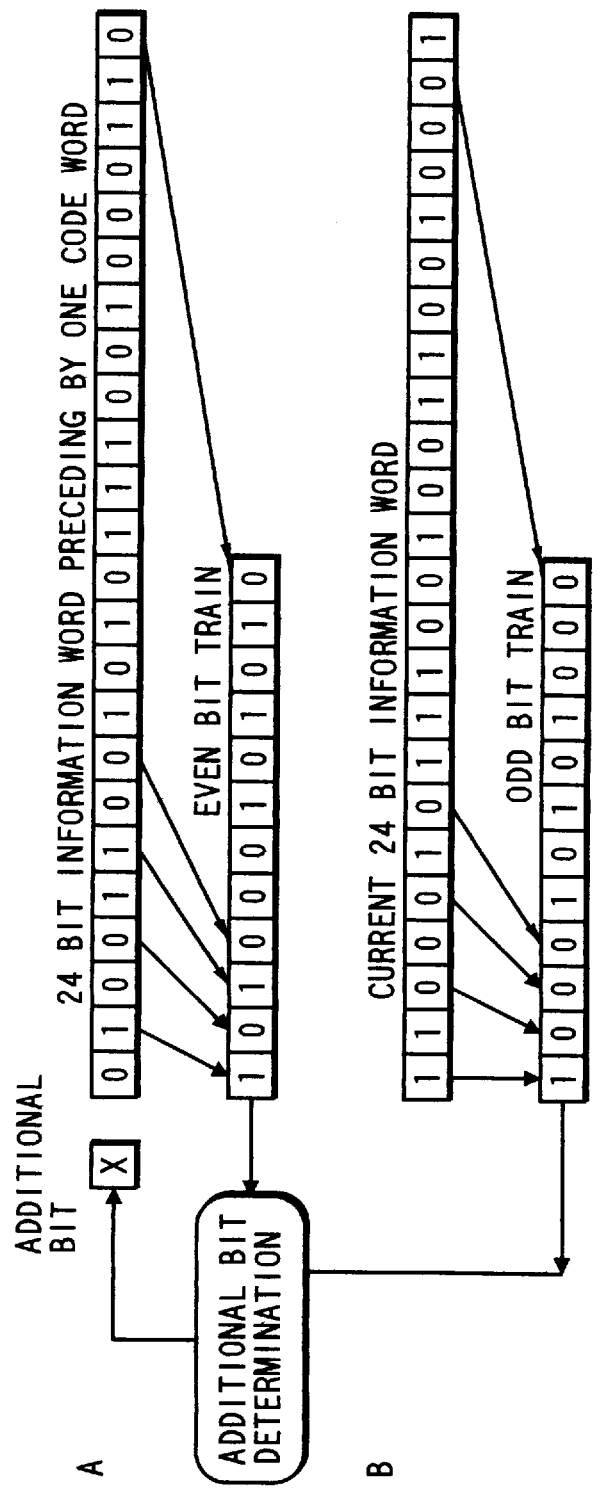
FIG. 11 is a diagram for explaining the modulating operation in the embodiment of the invention.

FIG. 11 is a diagram for explaining the deciding method of the control data in the embodiment. Similarly to FIG. 10, FIG. 11 shows a case where the even-number designated 12-bit data and the odd-number designated 12-bit data are extracted from the two sets of 24-bit data that were successively inputted.

In FIG. 11, A denotes 24-bit data inputted at present and B indicates 24-bit data preceding by one code word. A case of deciding the control data to be added to the data preceding by one code word will now be considered.

As mentioned above, each time the process of the odd 12-bit data is finished, the up/down counter in the discrimination circuit 106 is reset and the code check circuit operates and outputs the control data. This is nothing but when the odd data in the 24-bit data inputted at present is processed, the control data to be added to the 24-bit data preceding by one code word is determined.

Namely, in the embodiment, the even 12-bit data in the 24-bit data which is preceding by one code word and which is the data to be influenced when the control data is added to the 24-bit data preceding by one code word and the interleaved NRZI modulation is executed and the odd 12-bit data in the 24-bit data inputted at present are extracted and the control data to be added to the 24-bit data preceding by one code word is decided on the basis of the 24-bit data.

Therefore, the control data to be added to the 24-bit data inputted at present is not decided until the end of the process of the discrimination circuit 106 regarding the odd 12-bit data in the 24-bit data that will be inputted next.

According to the embodiment as described above, the maximum number of successive bits "0" or "1" is detected after the control data was added to the input data and the final 25-bit data was determined. Therefore, since it is sufficient to use only one check circuits to detect such a successive number, the circuit scale can be reduced.

The data is separated to the data that is influenced when the control data is added and the 2T precoding is executed and the data that is not influenced, the 1T preceding is executed, and those data is selectively outputted in accordance with the state of the control data, thereby obtaining the 2T precoded data. Therefore, the pilot signal component can be efficiently multiplexed to the recording data without enlarging the circuit scale.

In the embodiment, the data as much as two code words in the data that is influenced when the control data is added and the precoding is executed is extracted and the control data is decided by the operation circuit of one system on the basis of the extracted data. Therefore, the pilot signal component in the recording signal can be accurately detected.

Further, when the control data is decided, the EXOR between the signals in which the pilot signal component is expressed by rectangular waves of two values is calculated, thereby deciding the control data. Therefore, the arithmetic operation to detect the pilot signal component is extremely simplified.

In the above embodiment, although the synthesization circuit has been constructed by the register, inversion circuit, and selection circuit, it can also use other construction.

Figure 12:
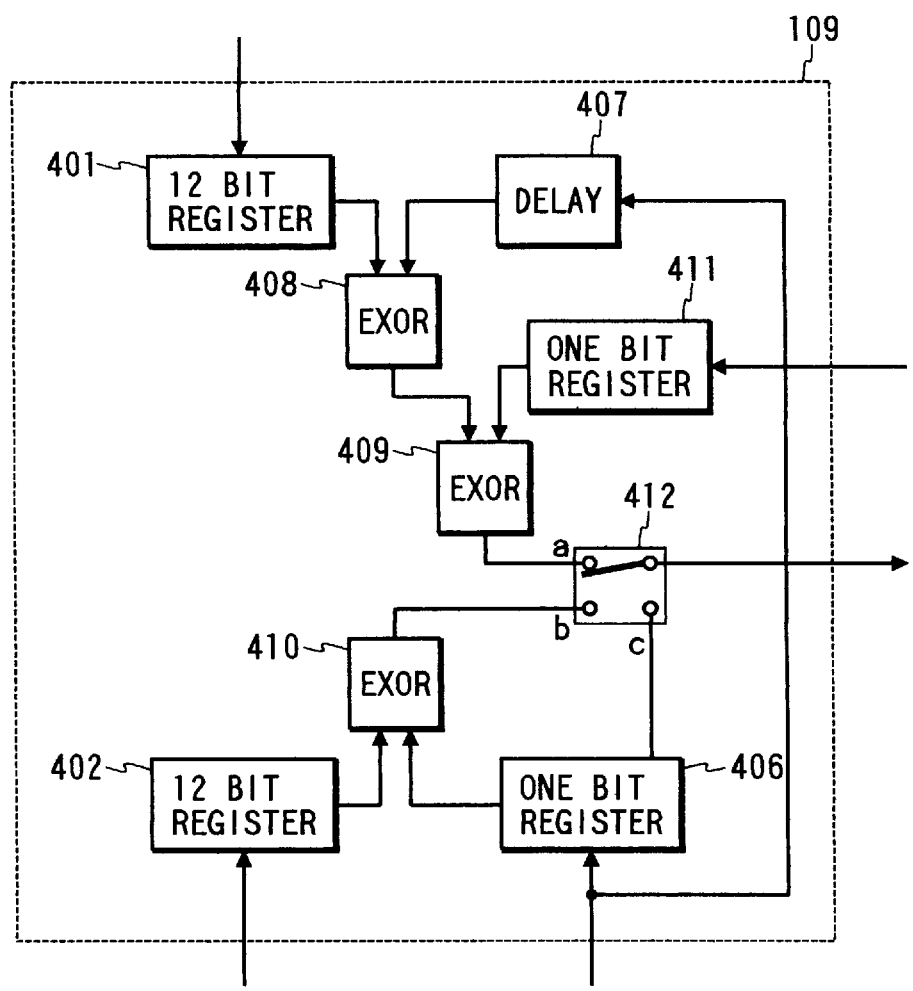
FIG. 12 is a diagram showing another construction of the synthesization circuit in FIG. 3.

FIG. 12 is a block diagram showing another construction of the synthesization circuit 109. In FIG. 10, the odd 12-bit data preceding by one code word of the data which was inputted at present and processed is supplied from the register 107 to the 12-bit register 401. The even 12-bit data preceding by one code word of the data which was inputted at present and processed is similarly inputted to the 12-bit register 402. The 1-bit data of the code check result generated from the discrimination circuit 106 is supplied to the 1-bit register 406. The EXOR circuit 410 calculates the EXOR between the check result data and the data stored in the register 402 and supplies to a switch 412.

The 1-bit data as a code check result generated from the discrimination circuit 106 is delayed by the delay circuit 407 and is inputted to an EXOR circuit 408. The delay circuit 407 delays the code check result of one code word in the input data and outputs the delayed data. Therefore, the code check result outputted for the 24-bit data preceding by one code word of the data inputted at present is supplied to the EXOR circuit 408. The EXOR circuit 408 calculates the EXOR between the code check result outputted from the delay circuit 407 and the odd 12-bit data from the 12-bit register 401 and sequentially supplies to an EXOR circuit 409.

The reason why the code check result is delayed and the EXOR between the delayed data and the odd 12-bit data of the input data is calculated is because, as mentioned above, when the control data (1-bit data as a code check result here) is added to the 24-bit data just before and the interleaved NRZI modulation is executed, the even data in the 25-bit data obtained by adding one bit of the control data to the 24-bit data inputted at present, namely, the odd data in the 24-bit data before the control data is added is influenced by the control data added to the 24-bit data just before and, further, "0" is used as initial data of the NRZI in the precoder 105 in the embodiment.

Further, the control data of one bit outputted from the check circuit 110 is supplied to the 1-bit register 411. An EXOR circuit 409 calculates the EXOR between the control data and the odd 12-bit data generated from the EXOR circuit 408 and supplies to the switch 412.

The switch 412 selects one of the outputs of EXOR circuits 409 and 410 and the 1-bit control data from the register 406 and transmits. Namely, the switch 412 is first connected to a (c) terminal and, after that, it is alternately connected to an (a) terminal and a (b) terminal. Precode data in which one bit of the control data is added to the 24-bit data inputted at present is generated.

Although the EXOR between the rectangular wave signals of two values and the input data has been calculated in the foregoing embodiment, the invention is not limited to such a construction. The control data can be also decided by detecting a correlation between the three-value signal and the four-value signal by a similar construction.

Although the control data has been decided on the basis of the data of two code words, it can be also decided by using the one code word or three or more code words.

Further, although the above embodiment has been described with respect to the case of executing the interleaved NRZI modulation to the input data, the invention is not limited to such a case. The invention can be also applied to any construction so long as the modulation is executed so that at least a part of the input data is influenced by the state of the control data. Similar operation and effect can be obtained.

As will be obviously understood from the above description, in the above embodiment, in the case where one of a plurality of control data is selectively added to the input data and a predetermined modulation is executed, even when it is necessary to change a part of the control data in accordance with the state of the modulated data, the state of the modulated data is detected by using the modulated data after the control data to be added was specified, so that there is no need to check the state with respect to the case where each of the plurality of control data was added.

When the control data is added to the input data and a predetermined modulation is executed, by selectively outputting the data that is influenced by the control data, the data that is not influenced, and the control data, the modulated data is obtained. Therefore, a specific frequency component in the modulated data can be controlled by a simple construction without enlarging the apparatus.

On the other hand, when the control data is added to the input data and the modulation is executed, a specific frequency component in the modulated data is detected on the basis of the data which is influenced by the control data at the time of the modulation of the input data and subsequent data. Therefore, the specific frequency component in the modulated data can be accurately and effectively detected without enlarging the apparatus.

What is claimed is:

1. An apparatus for performing a predetermined modulation of input data comprising a plurality of code words, including a predetermined code word and a subsequent code word, each of which comprises a a plurality of bits of digital data, so that at least a part of each code word is influenced by control data, and adding said control data to every code word, said apparatus comprising:

(a) separating means for separating each of the code words of the input data into a plurality of mutually-exclusive data groups, each of which comprises a plurality of bits of digital data, including a first data group and a second data group;

(b) modulating means for modulating data output from said separating means so that the first data group of the predetermined code word in the input data is influenced by said control data to be added to said predetermined code word, and the second data group of the subsequent code word in the input data is influenced by said control data to be added to said predetermined code word; and (c) generating means for generating said control data to be added to said predetermined modulated code word by using the first data group of said predetermined modulated code word and the second data group of said subsequent modulated code word, without using any other of the plurality of data groups of said predetermined modulated code word.

2. An apparatus according to claim 1, wherein said modulating means executes an interleaved NRZI modulation to (2n+1) bits of data obtained by adding one bit of the control data to each of the plurality of code words in the input data.

3. An apparatus according to claim 2, wherein said modulating means includes:

a modulation circuit for performing the NRZI modulation to n bits of odd-number designated data of the code word and n bits of even-number designated data of the code word;

inverting means for inverting a code of each of the n-bit data outputted from said modulation circuit; and selecting means for selectively outputting said control data generated by said generating means, said n-bit modulated data outputted from said modulation circuit and each of said n-bit inverted data outputted from said inverting means.

4. An apparatus according to claim 3, wherein said inverting means includes:

a first inverting circuit for inverting a code of said even-number designated n-bit modulated data of the first data group of said predetermined modulated code word by using said control data to be added to said predetermined code word; and a second inverting circuit for inverting a code of said odd-number designated n-bit modulated data of the second data group of said predetermined modulated code word by using said control data to be added to a previous code word.

5. An apparatus according to claim 1, further comprising means for detecting a specific frequency component in said modulated data, wherein said detecting means includes:

generation means for generating a two-value signal representative of a signal of said specific frequency component;

operating means for performing a logical operation between the modulated data and said two-value signal; and correlation detecting means for detecting a correlation between the modulated data and the signal of said specific frequency in accordance with an output of said operating means.

6. A digital data processing device for performing an interleaved NRZI modulation on input digital data comprising a plurality of code words, each of which comprises 2n bits of digital data, n being a positive integer, and adding control data to every code word, each of the code words having two mutually-exclusive data groups, comprising a first data group consisting of even-number designated n-bit digital data of the code word, and a second data group consisting of odd-number designated n-bit digital data of the code word, said device comprising:

(a) modulating means for performing the interleaved NRZI modulation on the input digital data so that the first data group of a predetermined code word is influenced by said control data to be added to the predetermined code word, and the second data group of the predetermined code word is not influenced by said control data to be added to the predetermined code word; and (b) generating means for generating the control data to be added to the predetermined code word by using the first data group of the predetermined modulated code word, without using the second data group of the predetermined modulated code word.

7. A device according to claim 6, wherein said generating means further generates the control data to be added to preceding 2n-bit digital data by using the odd-number designated n-bit data in said predetermined modulated data.

8. A device according to claim 6, wherein said generating means further generates the control data to be added to subsequent 2 n-bit digital data by using the even-number designated n-bit data in said modulated data.

9. A device according to claim 6, further comprising:
checking means for checking a sequence of specific data included in the modulated data of (2n+1) bits that is outputted from said modulating means; and
changing means for changing a portion of said (2n+1)-bit modulated data in accordance with an output of said checking means.

10. A digital data processing device for modulating input data comprising a plurality of code words, each of which comprises 2n bits of digital data, n being a positive integer, so that at least one n-bit part of the code word is influenced by control data, said device comprising:
(a) modulation means for modulating the plurality of code words so that a portion of a predetermined code word exerts an influence on a part of a subsequent code word;
(b) detection means for detecting a specific frequency component in the modulated data modulated by said modulation means;
(c) generation means for generating the control data to be added to the predetermined code word in accordance with a detection result of said detection means;
(d) inverting means for obtaining invented data of modulated data of the part of the predetermined code word that is influenced by the control data;
(e) selection means for selectively outputting the modulated data of the part of the predetermined code word that is influenced by the control data and the inverted data obtained by said inverting means according to the control data; and
(f) output means for selectively outputting the control data, an output of said selection means, and data of another n-bit part of the predetermined code word that is mutually exclusive of the one n-bit part and is not influenced by the control data.

11. A device according to claim 10, wherein said modulation means has separating means for separating each of the code words of 2n bits into data of n bits constructed by odd-number designated data that is the other part not influenced by said control data to be added to the predetermined code word and data of n bits constructed by even-number designated data that is the other part influenced by said control data to be added to the predetermined code word.

12. A device according to claim 11, wherein said output means first selects said control data of one bit generated by said generation means and, after that, alternately selects said odd-number designated n-bit data and said even-number designated n-bit data every n bits.

13. A device according to claim 10, wherein said detection means includes:
generating means for generating a two-value signal representative of a signal of said specific frequency;
operating means for performing a logical operation of the modulated data and said two-value signal; and
correlation detecting means for detecting a correlation between the modulated data and the signal of said specific frequency.

14. A device according to claim 10, wherein said generation means decides said control data so that a larger amount of said specific frequency component is included in the modulated data that is outputted from said modulated means.

15. A device according to claim 10, wherein said generation means decides said control data so that a smaller amount of said specific frequency component is included in the modulated data that is outputted from said modulating means.

16. A digital data processing device for modulating input data comprising a plurality of code words, each of which comprises 2n bits of digital data, n being a positive integer, so that at least a part of the code word is influenced by control data formed by a single-bit, and adding said control data to every code word, said device comprising:
(a) separating means for separating each of the code words of the input digital data into two mutually-exclusive n-bit data groups, comprising a first data group and a second data group;
(b) a 1T precoder for performing a 1T precoder operation on each of the code words, T being a bit period, the 1T precoder alternatively performing the 1T precoder operation on the first data group and the second data group;
(c) detection means for detecting a specific frequency component in the code word output from the 1T precoder;
(d) generation means for generating the control data according to a detection result of said detection means; and
(e) inverting means for inverting a code of each of the n bits of the first data group output from the 1T precoder according to the control data generated by said generation means.

17. A digital data processing device for modulating input data comprising a plurality of code words, including a predetermined code word and a subsequent code word, each of which comprises a plurality of bits of digital data, so that at least a part of each code word is influenced by control data, and adding the control data to every code word, each of the plurality of code words having a plurality of mutually-exclusive data groups, each of which comprises a plurality of bits of the digital data, including a first data group and a second data group, said device comprising:
(a) modulation means for modulating each of the plurality of code words of the input data so that the first data group of the predetermined code word is influenced by the control data to be added to the predetermined code word, and the second data group of the subsequent code word is influenced by the control data to be added to the predetermined code word;
(b) generation means for generating the control data to be added, to the modulated predetermined code word by using the first data group of the predetermined modulated code word and the second data group of the subsequent modulated code word; and
(c) inverting means for inverting a code of each of the plurality of bits of the first data group of the predetermined modulated code word according to the control data generated by said generation means.

18. A digital data processing apparatus for modulating input data comprising a plurality of code words, each of which comprises plural bits of digital data, so that at least a part of each code word is influenced by control data, and adding said control data to every code word, said apparatus comprising:
separating means for separating each of the code words of the input data into two mutually-exclusive data groups, comprising a first data group and a second data group;

modulation means for modulating output data from said separating means so that the first data group of a predetermined code word is influenced by said control data to be added to the predetermined code word, and the second data group of the predetermined code word is not influenced by said control data to be added to the predetermined code word; and generating means for generating said control data to be added to said predetermined modulated code word by using the first data group of said predetermined modulated code word and without using the second data group of said predetermined modulated code word.

19. An apparatus according to claim 18, further comprising control means for inverting a code of each of a plurality of bits of the first data group of said predetermined modulated code word according to said control data generated by said generating means, wherein said control means inverts the code of each of the plurality of bits of the first data group of said predetermined modulated code word according to said control data of a predetermined state, and selectively outputs said control data, the inverted first data group of said predetermined modulated code word, and the second data group of said modulated predetermined code work.

20. An apparatus according to claim 19, further comprising checking means for checking a sequence of specific data included in said predetermined modulated code word output from said control means and inverting the inverted first data group of said modulated code word according to the checking result.

21. An apparatus according to claim 19, wherein said control means selectively outputs said control data of a state different from the predetermined state, the first data group of said predetermined modulated code word, and the second data group of said predetermined modulated code word.

22. An apparatus according to claim 21, further comprising checking means for checking a sequence of specific data included in said predetermined modulated code word output from said control means and inverting the first data group of said modulated code word according to the checking result.

23. An apparatus according to claim 18, wherein said modulation means modulates the output data from said separating means so that the second data group of a subsequent code word is influenced by said control data to be added to said modulated predetermined code word, and said generating means generates said control data to be added to said modulated predetermined code word by using the second data group of the modulated subsequent code word.

24. An apparatus according to claim 18, wherein said modulation means includes a 1T precoder for performing a 1T precoder operation on the code word, T being a bit period, the 1T precoder alternatively performing the 1T precoder operation on the first data group and the second data group.

* * * * *

UNITED STATES PATENT AND TRADEMARK OFFICE
CERTIFICATE OF CORRECTION

PATENT NO. : 5,859,600

DATED : January 12, 1999

INVENTOR(S): SHINGO NOZAWA

It is certified that error appears in the above-identified patent and that said Letters Patent is hereby corrected as shown below:

COLUMN 2,
Line 19, "apparatus for" should be deleted.

COLUMN 3,
Line 23, "word)" should read --word) is--;
Line 24, "is out-" should be deleted; and
Line 25, "putted" should be deleted.

COLUMN 5,
Line 5, "got" should read --obtained--.

COLUMN 13,
Line 30, "invented" should read --inverted--.

COLUMN 15,
Line 21, "work." should read --word.--.

Signed and Sealed this

Seventeenth Day of August, 1999

Attest:

Q. TODD DICKINSON

*Attesting Officer*       *Acting Commissioner of Patents and Trademarks*